(12) United States Patent
Meine et al.

(10) Patent No.: US 9,142,700 B2
(45) Date of Patent: Sep. 22, 2015

(54) ASSEMBLY FOR SUPPORTING AND GROUNDING SOLAR PANELS

(71) Applicant: Ironridge, Inc., Willits, CA (US)

(72) Inventors: Shawn J. Meine, Phoenix, AZ (US); John S. Ash, Phoenix, AZ (US)

(73) Assignee: Ironridge, Inc., Hayward, CA (US)

( * ) Notice: Subject to any disclaimer, the term of this patent is extended or adjusted under 35 U.S.C. 154(b) by 203 days.

(21) Appl. No.: 13/653,226

(22) Filed: Oct. 16, 2012

(65) Prior Publication Data

US 2014/0102517 A1    Apr. 17, 2014

(51) Int. Cl.

| | |
|---|---|
| *H01L 31/042* | (2014.01) |
| *H01L 31/18* | (2006.01) |
| *F24J 2/52* | (2006.01) |
| *H02S 20/23* | (2014.01) |
| *H02S 20/10* | (2014.01) |
| *H01L 31/048* | (2014.01) |

(52) U.S. Cl.
CPC .............. *H01L 31/0422* (2013.01); *F24J 2/52* (2013.01); *H01L 31/18* (2013.01); *H02S 20/10* (2014.12); *H02S 20/23* (2014.12); *F24J 2/523* (2013.01); *F24J 2/5243* (2013.01); *F24J 2/5252* (2013.01); *H01L 31/0484* (2013.01); *Y02B 10/12* (2013.01); *Y10T 29/49355* (2015.01)

(58) Field of Classification Search
CPC ............ H01L 31/0422; H01L 31/0484; H01L 31/0485; F24J 2/523; F24J 2/5245; F24J 2/5252; F24J 2/5239; Y02B 10/12; Y02B 10/50; H02S 20/00

USPC ........................ 248/346.06, 237, 316.1, 316.7; 136/246, 251, 244; 52/173.3; 411/190; 211/26; 29/890.033

See application file for complete search history.

(56) References Cited

U.S. PATENT DOCUMENTS

| | | | |
|---|---|---|---|
| 5,746,839 A | 5/1998 | Dinwoodie | |
| 6,534,703 B2 | 3/2003 | Dinwoodie | |
| 7,921,843 B1 | 4/2011 | Rawlings | |
| 8,276,330 B2 * | 10/2012 | Harberts et al. | 52/173.3 |
| 8,572,909 B2 * | 11/2013 | Rivera et al. | 52/173.3 |
| 2004/0250491 A1 | 12/2004 | Diaz et al. | |
| 2007/0133474 A1 | 6/2007 | Farkas et al. | |
| 2008/0230047 A1 | 9/2008 | Shugar et al. | |
| 2009/0242014 A1 | 10/2009 | Leary | |
| 2009/0320904 A1 | 12/2009 | Botkin et al. | |
| 2010/0154784 A1 | 6/2010 | King et al. | |
| 2010/0212714 A1 | 8/2010 | Rothschild et al. | |
| 2011/0233157 A1 * | 9/2011 | Kmita | 211/41.1 |
| 2011/0290306 A1 | 12/2011 | Roberts | |
| 2012/0048351 A1 | 3/2012 | Rizzo | |
| 2013/0276867 A1 * | 10/2013 | Wildes et al. | 136/246 |

(Continued)

*Primary Examiner* — Tan Le
(74) *Attorney, Agent, or Firm* — Lance C. Venable

(57) ABSTRACT

In various representative aspects, an assembly for supporting and penetrating metallic solar panel frames to provide a grounding path between the panels, holding ballast of various masses to stabilize the solar panels, and allowing the solar panels to tilt to an adjustable angle is disclosed herein. The assembly has a support member with a pair of vertical components, a ballast holder and a mounting member with at least a raised portion to penetrate a surface of a solar panel and form a grounding path between the assembly and the solar panel. The mass of ballast is adjustable by placing various number of ballast blocks in the ballast holder to stabilize the attached solar panel. The mounting member is pivotally coupled to at least one of the vertical components of the support member so that the angle between the solar panel and the assembly may be adjusted.

25 Claims, 8 Drawing Sheets

(56) References Cited

U.S. PATENT DOCUMENTS

2014/0010616 A1* 1/2014 Meine et al. .................. 411/190
2014/0014158 A1* 1/2014 Wildes et al. ................. 136/246
2014/0060626 A1* 3/2014 Stephan et al. ............... 136/251

* cited by examiner

ASSEMBLY FOR SUPPORTING AND GROUNDING SOLAR PANELS

BACKGROUND OF INVENTION

The present invention relates generally to providing an apparatus that can support and penetrate metallic solar panel frames, providing a grounding path between the panels, holding ballast of various masses to stabilize the solar panels, and allowing the solar panels to tilt to an adjustable angle.

Solar panels generate electricity from sunrays. Like any electrical power systems, the panels should be grounded. Traditionally, a solar panel has a grounding wire that connects the panel to a grounding device. The more panels in a solar panel array, the more problematic sorting grounding wires becomes. It is preferable that the solar panel mounts provide sufficient grounding between the panels so that some panels may not need grounding wires.

Solar panels are generally mounted to a support surface at an angle between the panels and the support surface in order to receive more sunlight. The angle between the solar panels and the support surface is preferably adjustable so that the solar panels may be mounted on an uneven support surface with a slope. It is also desirable if the mass of ballast can be adjusted according to the wind lift or any environmental factors that affect the stability of the solar panel array. Moreover, it is desirable that the solar panel mounting apparatuses are easy to manufacture and install to save time and cost.

Existing solutions are complicated to manufacture or install and are not satisfactory in providing all desired features. For example, US patent publication number US 2009/00242014 A1 (Leary), discloses an apparatus for supporting and ballasting solar panels. The apparatus has a ballast member, a mounting module, and an attachment module to attach to the solar panel(s). The ballast is part of the apparatus, and the weight of the apparatus cannot be adjusted according to the condition of the support surface, e.g. the slope of the rooftop. Although the apparatus may provide a grounding connection between solar panels if the panels' grounding wires are attached to the mounting module, grounding wires are still necessary.

The PV module assembly taught by US patent publication number US 2009/00320904 A1 (Botkin et al.) has a removable ballast tray adapted to adjust the weight of the ballast. But, the angle between the ballast tray and the solar panel frame is not adjustable. The ballast tray is located under the solar panel, which leaves limited room to place ballast blocks. Moreover, the assembly itself comprises a frame of solar modules and is not merely a solar panel mounting apparatus. It is not designed to be compatible with existing solar panels, and nothing is taught about grounding paths between solar panels.

US patent publication number US 2008/00230047 (Shugar et al.) teaches a ballasting system that may be used to adjust the angle between a solar panel and the support surface. This system is complicated as it comprises different types of ballast to retain a solar panel and the weights of the ballast are not adjustable at the time of installation. No improvement to the grounding feature is mentioned in this publication.

In sum, although a solar panel mounting apparatus that comprises ballasting and electrical grounding features that is easy to use and manufacture is desired, such need is not yet satisfied.

SUMMARY OF THE INVENTION

The invention is summarized below only for purposes of introducing embodiments of the invention. The ultimate scope of the invention is to be limited only to the claims that follow the specification.

It is an object of this invention to provide a solar panel mounting apparatus that is easy to install and manufacture.

It is a further object of this invention to provide a solar panel mounting apparatus for supporting and stabilizing a solar panel.

It is also an object of this invention to provide a solar panel mounting apparatus where the angle between the solar panel and its support surface, such as a ground or rooftop, is adjustable. By making the angle adjustable, the solar panel and the apparatus can be mounted on an uneven surface.

An embodiment of this invention is an assembly comprising at least one support member with a pair of vertical components, a ballast holder, and at least one mounting member. The mounting member is used to couple a solar panel to at least one of the vertical components of the support member. A fastening member, such as a clamp, may be used with the mounting member to secure the solar panel. The mounting member may have one or more raised portions for penetrating the surface of the solar panel. The raised portion may be a tooth or other similar structure as long as it has a sharp ridge, or any kind of configuration that is suitable for penetrating metallic surfaces. An example of a mounting member may be a base with a grounding clip, such as a WEEB-UMC washer. When multiple solar panels are attached to the assembly, the assembly may provide a grounding path between the solar panels. A grounding member, such as a WEEB grounding lug, may be attached to the assembly so that the grounding path from the solar panel to the assembly is further connected to the support surface.

The mounting member pivots about an axis relative to the vertical component of the support member that the mounting member is coupled to, in order to better conform to the solar panel and to allow the panel to slant to a preferred angle. For an embodiment coupled to multiple solar panels, each mounting member may independently tilt to a different direction in order to accommodate fluctuations of the support surface or the solar panels.

Various numbers of ballast blocks may be placed in the ballast holder so that the ballasting weight is adjustable. Securing the ballast blocks to the ballast holder may be desired in high wind environments or where seismic conditions may exist. The ballast blocks may be secured using a cover, wire tie, strap, or any other suitable securing mechanism. The ballast holder may also have integrated ballast block retention features to secure the ballast blocks in place.

Wind deflectors may be used to reduce wind lift and provide stability. The wind deflectors may be attached together to form a beam for assemblies on the same row of a solar array. As such, wind lift is distributed among the assemblies, thus providing more stability and further reducing the number of ballast blocks required. For a better seismic lateral stability, a seismic anchor may be secured to the assembly and the support surface. If the support surface is a rooftop, the seismic anchor may be secured directly to the building structure through roofing material or decking.

For example, two exemplary assemblies may be used to support a solar panel on a rooftop. Preferably, each assembly may have a pair of support members with a pair of vertical components (although a single support member could be sufficient depending on its shape), a ballast holder, mounting members, and clamps that act as fastening members. Solar panels are generally slanted toward the south to receive more sunlight in the northern hemisphere. One assembly is used to clamp the solar panel on the north side and the other clamps the panel on the south side. The angle between the solar panel and the rooftop can be adjusted by pivoting the mounting members. If each of the support members has two vertical components with different heights, the two mounting members and clamps can be placed on the same vertical component. The mounting members and clamps of the assembly supporting the northern side of the panel are located at the top of each of the longer vertical components of the support members. On the other hand, the mounting members and clamps of the assembly supporting the southern side of the solar panel are located at the top of the shorter vertical component of the support members, which enable the solar panel to slant more towards the south.

This formation is just one of the ways to use this invention. A person with ordinary skill in the relevant art would know that various formations can be adopted to make use of this invention. Also, any shape or size of the components in this invention, e.g. the support members, the ballast holder, or the mounting member, may be adopted as long as the apparatus can attach to one or more solar panels and provide a grounding path. Any combinations of suitable number, shape, and size of raised portions of a mounting member or the fastening member may be used. The weight that a ballast holder can support depends on the implementation. Also, any materials suitable to achieve the object of the current invention may be chosen, such as stainless steel or metallic materials.

BRIEF DESCRIPTION OF THE DRAWINGS

A more complete understanding of the present invention may be derived by referring to the detailed description and claims when considered in connection with the following illustrative figures. In the following figures, like reference numbers refer to similar elements and steps throughout the figures.

DETAILED DESCRIPTION OF EXEMPLARY EMBODIMENTS

In the following description, and for the purposes of explanation, specific details are provided to thoroughly understand the various aspects of the invention. It will be understood, however, by those skilled in the relevant arts, that the present invention may be practiced without these details. In other instances, known structures and devices are shown or discussed more generally in order to avoid obscuring the invention. In many cases, a description of the operation is sufficient to enable one to implement the various forms of the invention, particularly when the operation is to be implemented in software. It should be noted that there are many different and alternative configurations, devices and technologies to which the disclosed embodiments may be applied. The full scope of the inventions is not limited to the examples that are described below.

Figure 1:
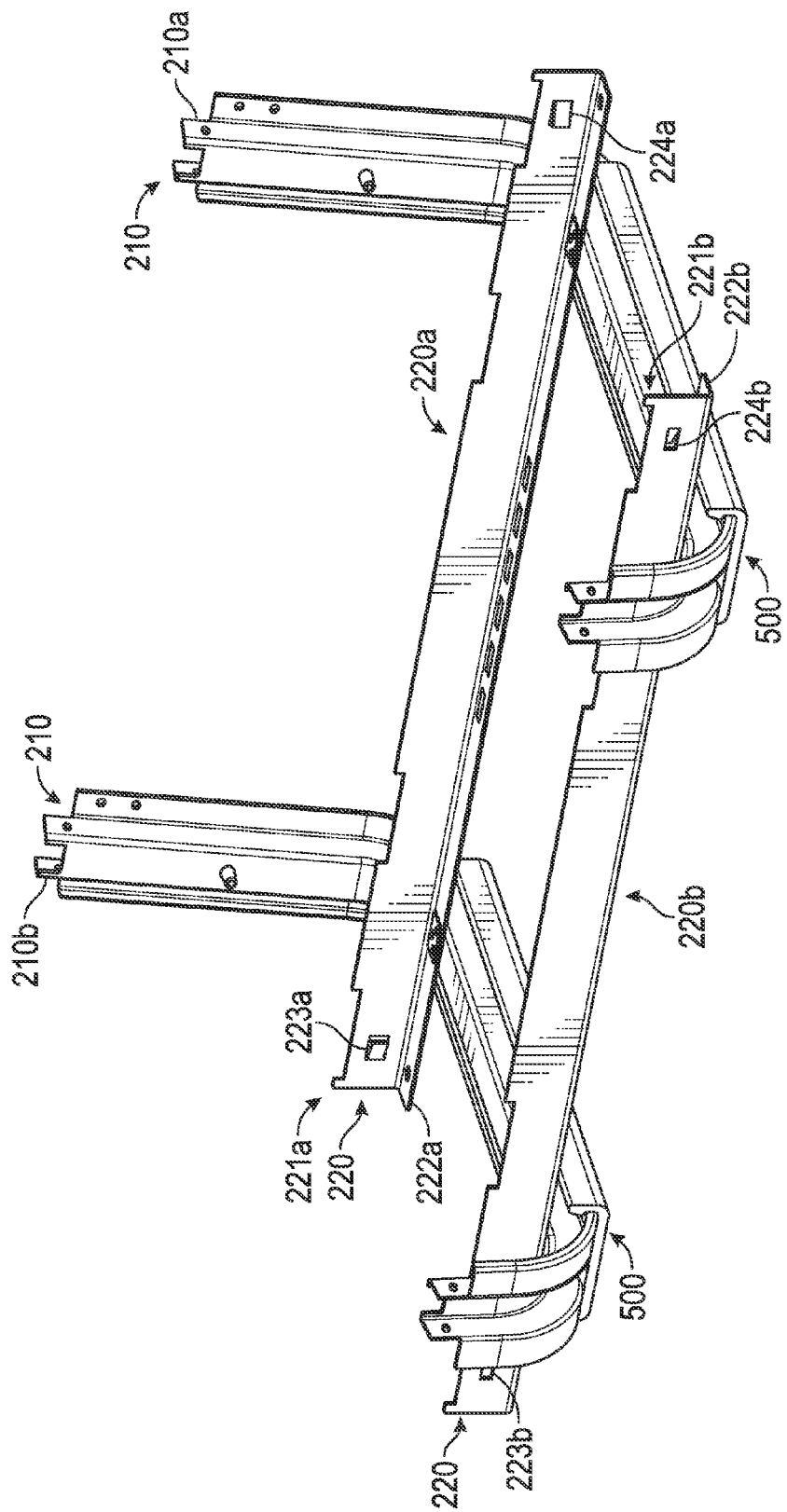
FIG. 1 illustrates a pair of support members placed on pads and a ballast holder transversely coupled to the support members.

FIG. 1 illustrates an embodiment of the support member 210 with pads 500 and the ballast holder 220. In this embodiment, the U-Shaped bars 210a & 210b together constitute the support member 210 which comprises two vertical components and one of the vertical components is longer than the other. The U-Shaped bars 210a & 210b each have vertical arms of different heights. The longer arms of the U-shaped bars 210a & 210b are located at a rear side, forming the longer vertical component of the support member 210. The shorter arms of the U-Shaped bars 210a & 210b at the front form the shorter vertical component of the support member 210.

The ballast holder 220 includes two angle bars, 220a & 220b. The angle bars 220a & 220b of the ballast holder 220 have vertical portions 221a & 221b and horizontal portions 222a & 222b. The vertical portions 221a & 221b of the angle bars 220a & 220b may prevent the ballast blocks from moving toward the front or rear sides while the horizontal portions 222a & 222b support the ballast blocks.

The vertical portions 221a & 221b of the angle bars 220a & 220b in this embodiment may include tabs 223a, 223b, 224a & 224b to prevent the ballast blocks from moving laterally. The tabs 223a, 223b, 224a & 224b are located on both sides and protrude in the direction where the ballast blocks are placed so when they are placed within the area surrounded by the tabs 223a, 223b, 224a & 224b, they can be retained when an external force, resulting for example from an earthquake, is applied. The tabs 223a, 223b, 224a & 224b may also be located on the horizontal portions 222a & 222b and protrude upward or anywhere in the ballast holder suitable for retaining ballast blocks.

Pads 500 may protect the support surface from possible damage over time. They may also help distribute loading on the support surface. Pads 500 may be rubber or any suitable material. Pads 500 may be configured to surround a portion of the support member 210. The pads 500 of this embodiment conform to the shape of the bottom of the U-Shaped bars 210a & 210b. As such, they can be secured onto the bottom of the U-Shaped bars 210a & 210b before being installed with the solar modules, thus saving time for installation.

Figure 2:
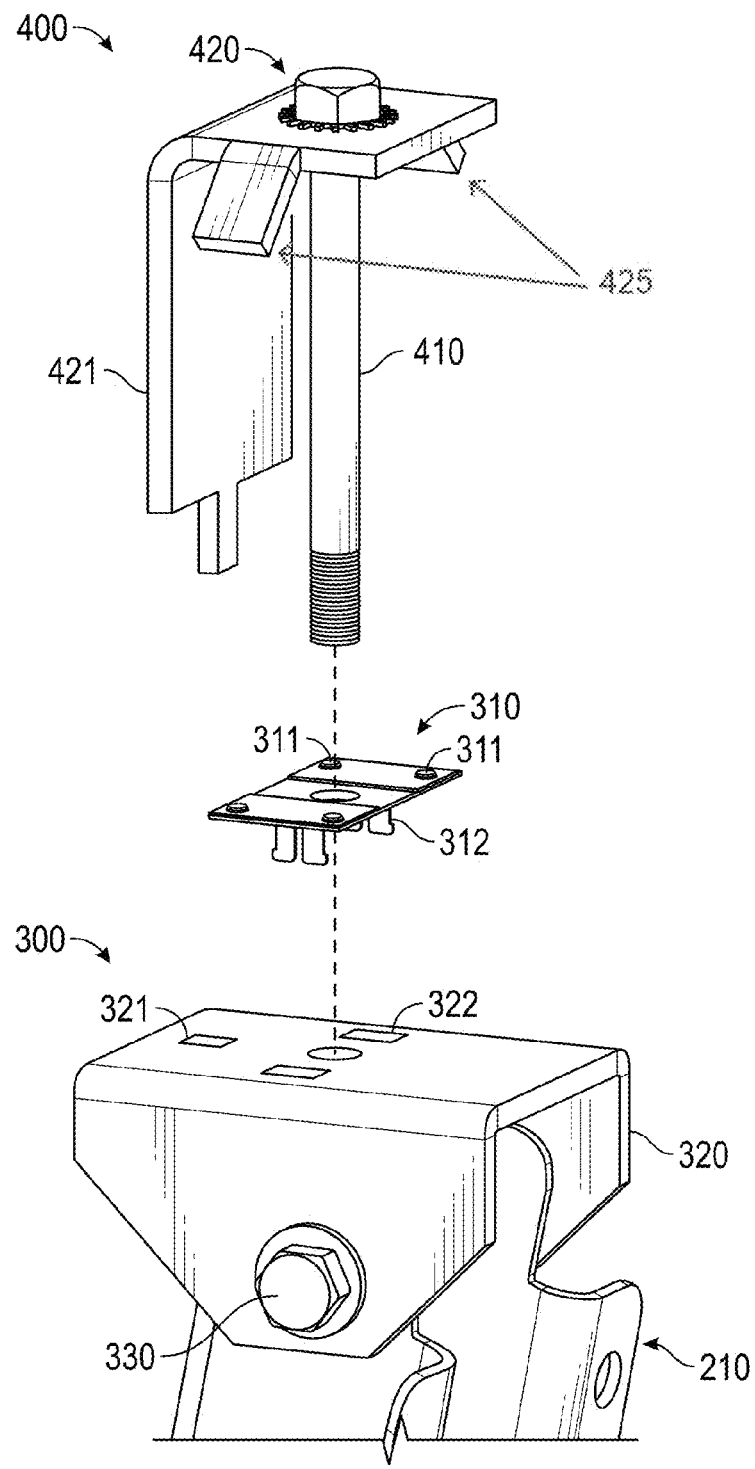
FIG. 2 illustrates a mounting member and a fastening member of an embodiment.

FIG. 2 depicts the relative positions of an exemplary mounting member 300 and a clamp 400 before they are assembled. The mounting member 300 comprises a grounding clip 310, a base 320, and a bolt 330. The grounding clip 310 has multiple raised portions 311 and spring retention tabs 312. The spring retention tabs 312 are disposed through the holes 322 to engage the grounding clip 310 to the base 320.

The mounting member 300 is attached to at least one of the vertical components of the support member 210 with the bolt 330. The bolt 330 forms an axis for the mounting member 300 to pivot, relative to the support member 210, in order to better conform to the solar panel and to allow the solar panel to slant to a preferred angle. Each mounting member 300 in an embodiment may independently tilt to a different direction.

Figure 5:
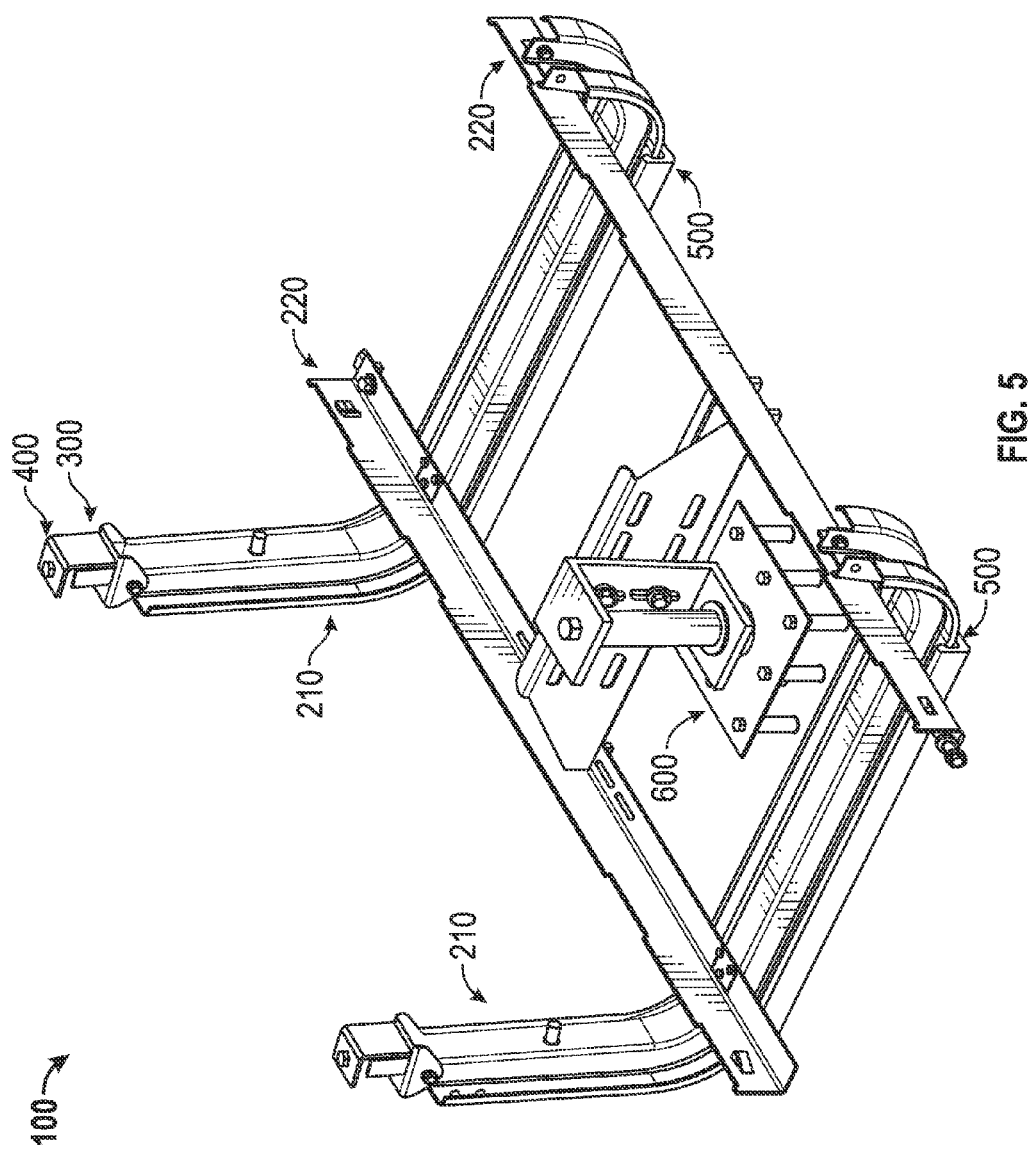
FIG. 5 illustrates an embodiment coupled to a seismic anchor.

A clamp 400, which acts as a fastening member of the embodiment, has a fastener 410 and an elongated washer 420. The washer 420 has a tab 421 on one side that extends downward from the washer 420 and may engage the base 320 through a void 321 for stabilizing the to-be-attached solar panel frame 011 as shown in FIG. 5. An alternate embodiment of the washer 420 may also have raised portions on the bottom of the washer 420 to penetrate the surface of the solar panels in order to have a better grip and provide better grounding capability. The washer may also include one or more spacers 425. The spacers 425 provide a buffer between the solar panel frame 011 and the fastener 410. The spacers 425 typically extend downward at an acute angle with respect to the washer 420.

Figure 3:
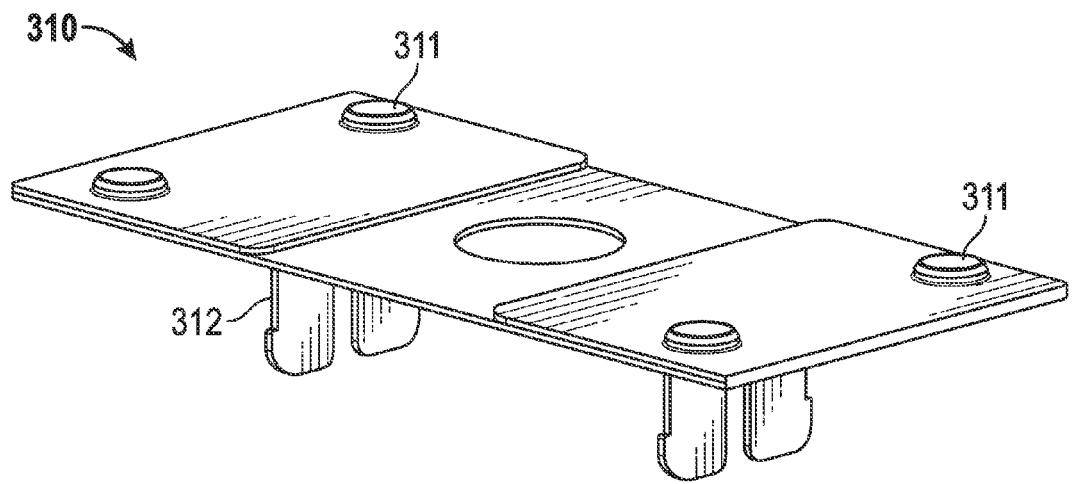
FIG. 3 illustrates a grounding clip used in FIG. 2 as a part of the mounting member.

FIG. 3 shows a closer view of the grounding clip 310 in FIG. 2. The grounding clip 310 has raised portions 311 and spring retention tabs 312. The raised portions 311 have sharp edges that may penetrate the coating of solar panels to provide better electrical bonding capabilities.

Figure 4:
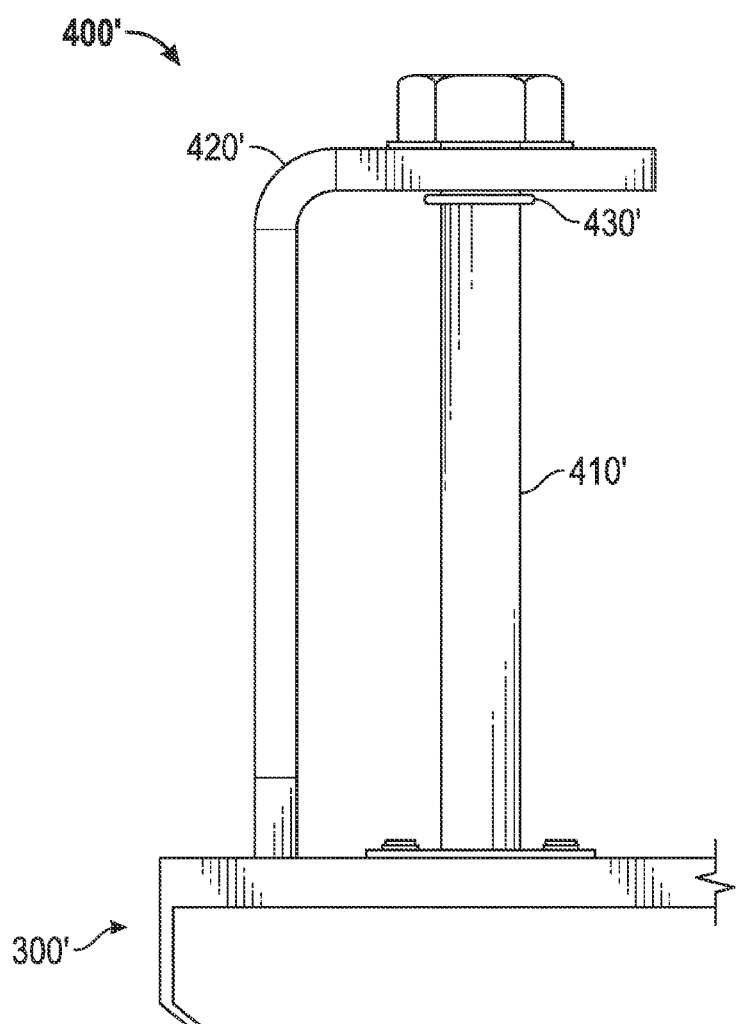
FIG. 4 illustrates a side view of an alternative embodiment of the fastening member in FIG. 2.

FIG. 4 illustrates the side view of a clamp 400', an alternative embodiment of the clamp 400 in FIG. 2, without side tabs on the washer 420'. After this embodiment is installed, a solar panel frame will rest against the fastener 410' and be secured between the top of the washer 420' and the mounting member 300. It is more difficult to accomplish this task without lifting the washer 420' upward and putting the solar panel between the washer 420' and the mounting member 300. To save this trouble, the clamp 400' may further comprise a packing 430' such as an O-ring that engages the fastener 410' in order to hold the washer 420' in place. The fastener 410' is first loosely fastened to the mounting member 300, and the packing 430' supports the washer 420' at the top of the shaft of the fastener 410', thus leaving extra room for installing the solar panel frame before fastening the clamp 400' to firmly secure the solar panel. The packing 430' can be made of rubber, plastic or any material suitable for holding the washer 420' in place before clamping the solar panel.

FIG. 5 illustrates an exemplary assembly 100 having two fastening members 400, two mounting members 300, support member 210, and a ballast holder 220. The assembly 100 is placed on pads 500 and coupled with a seismic anchor 600. A seismic anchor 600 may provide lateral stability to the assembly 100 when the anchor 600 is secured directly to a support surface, such as a ground or a building structure.

Figure 6:
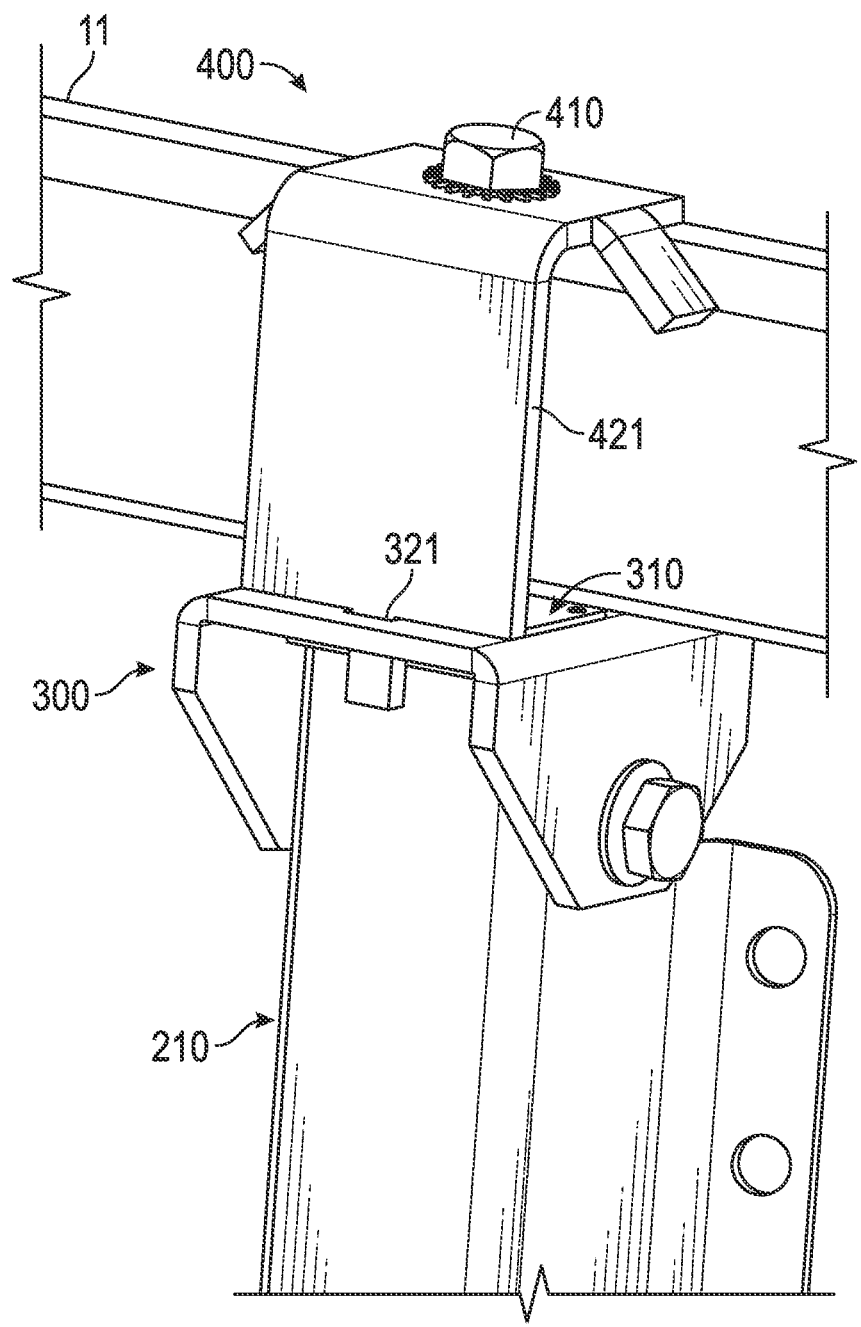
FIG. 6 illustrates a portion of the embodiment in FIG. 2 coupled to a solar panel frame.

FIG. 6 shows the embodiment in FIG. 2 with a clamp 400, a mounting member 300, and a vertical component of the support member 210 coupled to a solar panel frame 011. The frame 011 is fastened by the clamp 400 and the mounting member 300. The raised portions 311 as shown in FIG. 2 of the mounting member 300 penetrate the contacting surface of the frame 011, thus forming a grounding path from the panel frame 011, through the mounting member 300, and finally to the support member 210. If a grounding member is used, the solar panel is electrically bonded to a support surface such as a ground or a roof of a building.

Figure 7:
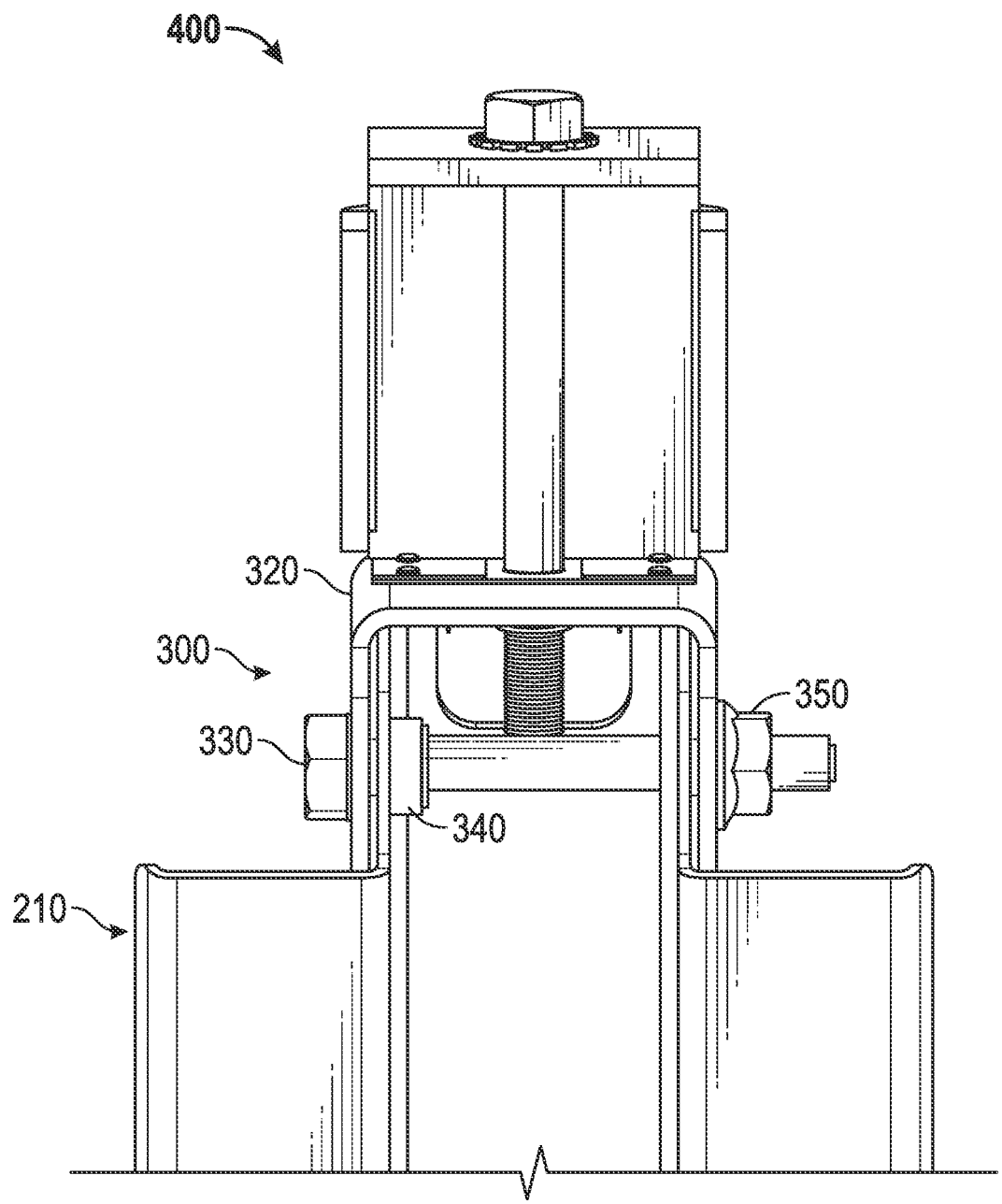
FIG. 7 illustrates a method of electrically bonding a mounting member and a support member.

FIG. 7 illustrates how a mounting member 300 and a support member 210 can be electrically bonded together without a grounding strap. A bolt 330 and a nut 350 are used to couple the base 320 of the mounting member 300 to at least one of the vertical components of the support member 210 in this embodiment. A sufficient force is applied to secure the bolt 330 and the nut 350 to compress the base 320 and the vertical component of the support member 210 together so that they become electrically bonded. Another nut with internal threads 340, such as a PEM® nut, may also be used if there are at least two contact areas between the base 320 and the support member 210 to reinforce the force to compress the base 320 and the support member 210 together. Any person skilled in the relevant art would likely know that electrical bonding can be achieved with a sufficient force to increase the contact area between the base 320 and the support member 210 no matter how they are coupled together.

Figure 8A:
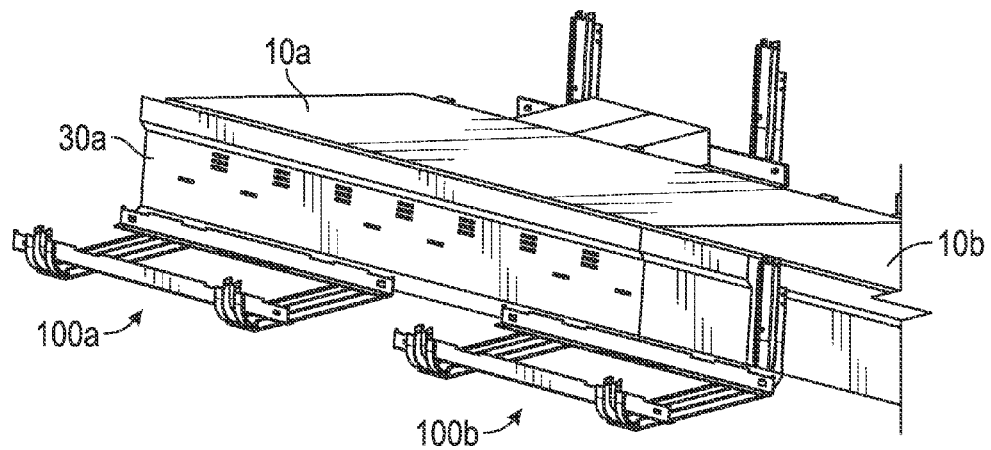
FIGS. 8a & 8b illustrate a method of distributing wind lift between or among multiple assemblies.
Figure 8B:
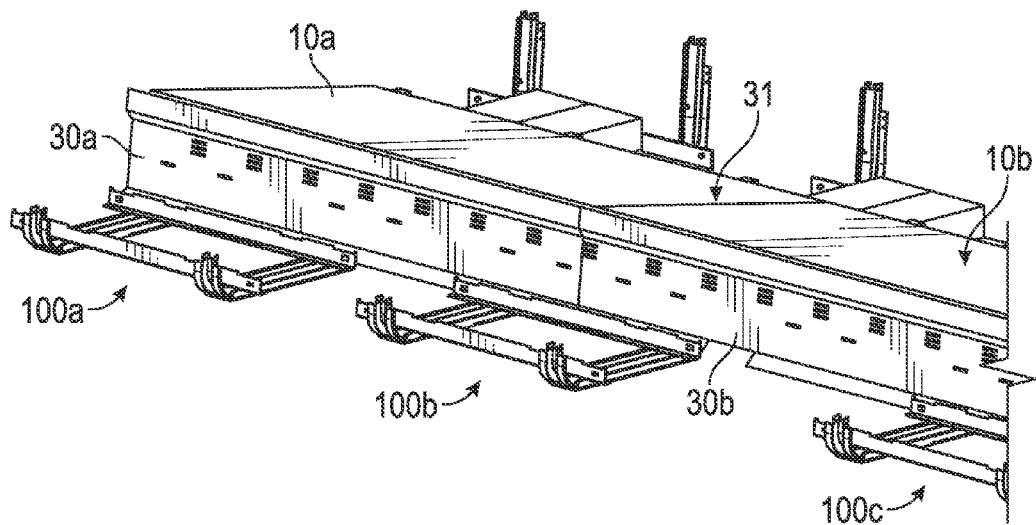

FIGS. 8a & 8b illustrate a method of distributing uplift forces among multiple assemblies 100a, 100b, & 100c, and thus providing more stability to the solar array. In FIG. 8a, a first wind deflector 030a is attached to the assemblies 100a & 100b. In FIG. 8b, a second wind deflector 030b is attached to assemblies 100b & 100c and slightly overlaps with the first wind deflector 030a. As shown in FIG. 8a, the right end of the wind deflector 030a aligns with the right end of the solar panel 010a for illustration purposes. Comparing FIG. 8a and FIG. 8b, the overlapped portion 031 starts from the left end of the second wind deflector 030b to the right end of the solar panel 010a. The overlapping wind deflectors 030a & 030b form a "beam" and distribute uplift forces among the assemblies 100a, 100b, & 100c. Therefore, less ballast blocks are needed. A person skilled in the relevant art would likely know that the length of the wind deflector and the distance between the assemblies may vary, thus the number of wind deflectors needed and the size of the area overlapped to achieve the same feature may be different.

Figure 9:
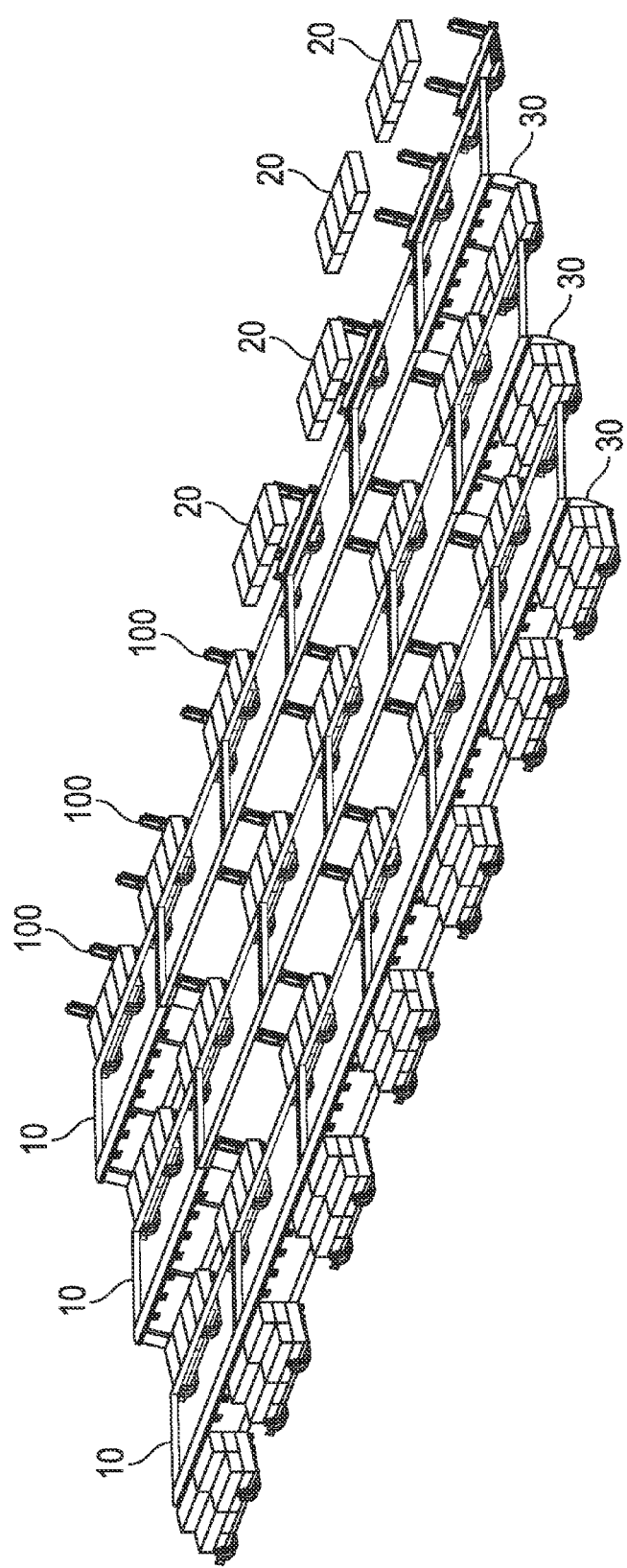
FIG. 9 illustrates multiple assemblies of an embodiment used with solar panel arrays.

FIG. 9 shows how multiple assemblies 100 of an exemplary embodiment are coupled to three rows of solar panels 010. The assemblies 100 are aligned between adjacent rows of the solar panels 010. The assemblies 100 support the solar panels 010 and allow them to slant, by having different heights on different sides of the assemblies 100. As shown in the figure, an assembly 100 may connect to one or more panels. Some assemblies 100 are coupled to panels 010 on the same row. Some assemblies 100 are coupled to panels 010 on different rows while others connect panels 010 both on the same row and on adjacent rows. Therefore, the assemblies 100 provide grounding paths among the solar panels 010 not only on the same row but also on adjacent rows. In addition, various numbers of ballast blocks 020 are placed in the ballast holders 220 of the assemblies 100 to secure the solar panels 010 in place. Some of the assemblies 100 have wind deflectors 030 on one side to reduce wind lift.

What is claimed is:

1. An assembly for securing a solar panel and providing a grounding path between the solar panel and the assembly comprising:
   a. a support member further comprising a pair of vertical components wherein one of the vertical components is longer than the other;
   b. a ballast holder transversely coupled to the support member; and
   c. a mounting member pivotally coupled to at least one of the vertical components of the support member wherein the mounting member comprises;
      i. a grounding clip comprising a raised portion for penetrating a surface of the solar panel and providing a grounding path between the solar panel and the assembly; and
   d. a clamp further comprising:
      i. a washer
      ii. a tab extending downward from the washer wherein the tab is coupled to the mounting member; and
      iii. a fastener coupled to the washer wherein the fastener extends downward and is secured to the mounting member.

2. The assembly of claim 1, wherein the mounting member further comprises a first void wherein the tab is coupled to the mounting member through the void.

3. The assembly of claim 1, wherein the washer conforms to a shape of the solar panel.

4. The assembly of claim 1, wherein the fastener is a threaded bolt and is secured to the mounting member through a threaded hole in the mounting member and passes through the grounding clip.

5. The assembly of claim 1, wherein the grounding clip further comprises a spring retention tab wherein the spring retention tab is coupled to the mounting member through a second void in the mounting member.

6. The assembly of claim 1, wherein the fastening member further comprises a packing that engages the fastener for maintaining the washer in place relative to the fastener as the solar panel is being secured to the assembly.

7. The assembly of claim 1, further comprising a pad secured to a bottom portion of the support member.

8. The assembly of claim 1, wherein the ballast holder further comprises a tab for retaining a ballast.

9. The assembly of claim 6 wherein the packing is an O-ring.

10. The assembly of claim 1 wherein the washer further comprises a raised portion that extends downward from the washer for penetrating the top surface of the solar panel such that when the raised portion penetrates the solar panel a grounding path between the solar panel and the assembly is created.

11. The assembly of claim 1 wherein at least one of the vertical components of the support member further comprises a wind deflector.

12. The assembly of claim 1 wherein the washer further comprises a spacer that extends downward at an acute angle with respect to the washer.

13. A method of installing an assembly for securing a solar panel and providing a grounding path between the solar panel and the assembly comprising the steps of:
   a. providing a support member further comprising a pair of vertical components wherein one of the vertical components is longer than the other;
   b. transversely coupling a ballast holder to the support member; and
   c. pivotally coupling a mounting member to at least one of the vertical components of the support member;
   d. coupling a grounding clip to the mounting member wherein the grounding clip further comprises a raised portion for penetrating a surface of the solar panel and providing a grounding path between the solar panel and the assembly; and
   e. securing a clamp to the mounting member wherein the clamp further comprises:
      i. a washer;
      ii. a tab that extends downward from the washer; and
      iii. a fastener that extends downward;
      iv. wherein the clamp is secured to the mounting member by:
         1. coupling the tab to the mounting member; and
         2. securing the fastener to the mounting member.

14. The method of claim 13, wherein the step of coupling the tab to the mounting member is accomplished by inserting the tab into a void in the mounting member.

15. The method of claim 13, wherein the step of securing the fastener to the mounting member is accomplished by inserting a threaded bolt through a hole in the grounding clip.

16. The method of claim 13, wherein the grounding clip further comprises a spring retention tab and further comprises the step of inserting the spring retention tab through a second void in the mounting member.

17. The method of claim 13, wherein the fastening member further comprises a packing that engages the fastener for maintaining the washer in place relative to the fastener as the solar panel is being secured to the assembly.

18. The method of claim 13, further comprising the step of coupling a grounding member to the ballast holder for electrically bonding the assembly to a support surface.

19. The method of claim 13, further comprising the step of coupling a pad to a bottom portion of the support member.

20. The method of claim 13, wherein the ballast holder further comprises a tab for retaining a ballast.

21. The method of claim 13, further comprising the step of applying a force to increase a contact area between the mounting member and at least one of the vertical components of the support member for forming an electrical bond.

22. The method of claim 13, further comprising the steps of:
   a. coupling a first wind deflector to at least one of the vertical components of the support member; and
   b. coupling a second wind deflector to the first wind deflector with the second wind deflector and the first wind deflector partially overlapped.

23. The method of claim 13 wherein the packing is an O-ring.

24. The method of claim 13 wherein the clamp further comprises a raised portion that extends downward from the washer and further comprising the step of coupling the raised portion to the solar panel by penetrating the raised portion into the top surface of the solar panel and creating a grounding path between the solar panel and the assembly.

25. A method of installing an assembly for securing a solar panel and providing a grounding path between the solar panel and the assembly comprising the steps of:
   a. providing a support member further comprising a pair of vertical components wherein one of the vertical components is longer than the other;
   b. transversely coupling a ballast holder to the support member; and
   c. pivotally coupling a mounting member to at least one of the vertical components of the support member wherein the mounting member further comprises a raised portion for penetrating a surface of the solar panel and providing a grounding path between the solar panel and the assembly;
   d. coupling a first wind deflector to at least one of the vertical components of the support member; and
   e. coupling a second wind deflector to the first wind deflector with the second wind deflector and the first wind deflector partially overlapped.

* * * * *